United States Patent [19]

Kinoshita

[11] Patent Number: 5,247,536
[45] Date of Patent: Sep. 21, 1993

[54] SEMICONDUCTOR LASER DISTRIBUTED FEEDBACK LASER INCLUDING MODE INTERRUPT MEANS

[75] Inventor: Junichi Kinoshita, Yokohama, Japan

[73] Assignee: Kabushiki Kaisha Toshiba, Kawasaki, Japan

[21] Appl. No.: 936,367

[22] Filed: Sep. 2, 1992

Related U.S. Application Data

[63] Continuation of Ser. No. 734,672, Jul. 23, 1991, abandoned.

[30] Foreign Application Priority Data

Jul. 25, 1990 [JP] Japan ................... 2-194984

[51] Int. Cl.⁵ ............................ H01S 3/08; H01S 3/19
[52] U.S. Cl. ....................................... 372/96; 372/46; 372/98; 372/102; 372/49; 372/50
[58] Field of Search ............ 372/19, 43, 45, 46, 372/96, 92, 102; 357/16, 17, 19; 257/12

[56] References Cited

U.S. PATENT DOCUMENTS

| | | | |
|---|---|---|---|
| 4,282,494 | 8/1981 | Yonezu et al. | 357/17 X |
| 4,516,243 | 5/1985 | Utaka et al. | 372/96 |
| 4,573,163 | 2/1986 | Kaminow | 372/96 |
| 4,716,132 | 12/1987 | Hirata | 372/96 |
| 4,720,836 | 1/1988 | Fukuzawa et al. | 372/96 |
| 4,722,092 | 1/1988 | Liau et al. | 372/96 |
| 4,796,274 | 1/1989 | Akiba et al. | 372/96 |
| 4,827,482 | 5/1989 | Towe et al. | 372/44 |
| 5,020,072 | 5/1991 | Abe et al. | 372/96 |
| 5,093,835 | 3/1992 | Takemoto et al. | 372/96 |
| 5,105,431 | 4/1992 | Tanaka | 372/96 |
| 5,185,759 | 2/1993 | Matsuyama | 372/96 |
| 5,187,717 | 2/1993 | Horita et al. | 372/96 |

FOREIGN PATENT DOCUMENTS

| | | | |
|---|---|---|---|
| 0214866 | 3/1987 | European Pat. Off. | 372/43 X |
| 55-156381 | 12/1980 | Japan | 372/43 X |

OTHER PUBLICATIONS

IEEE Journal of Quantum Electronics; vol. QE-23, No. 6, Jun. 1987; "Stability in Single Longitudinal Mode Operation in GaInAsP/InP Phase-Adjusted DFB Lasers"; H. Soda et al., pp. 804–814.

Electronics Letters, vol. 24, No. 10, May 12, 1988, Stevenage, Herts, GB pp. 623–624; Y. Uenishi et al, "Beam Converging Laser Diode by Taper Ridge Waveguide".

*Primary Examiner*—Brian Healy
*Attorney, Agent, or Firm*—Oblon, Spivak, McClelland, Maier & Neustadt

[57] ABSTRACT

A buried heterostructure type distributed feedback semiconductor laser comprises a semiconductor substrate transparent to an oscillation light beam, a laser stripe including a diffraction grating, an active layer, and a guiding layer formed on the semiconductor substrate, and semiconductor peripheral region formed so as to cover the laser stripe on the semiconductor substrate. The semiconductor peripheral region is transparent to an oscillation light beam. Rectangular grooves are formed near both sides of emission facet of the laser stripe more deeply than the laser stripe. Since a radiation mode from the laser stripe is reflected and scattered by the grooves, it cannot hardly reach the emission facet. Therefore, the radiation mode does not interfere with an output beam from the laser.

11 Claims, 4 Drawing Sheets

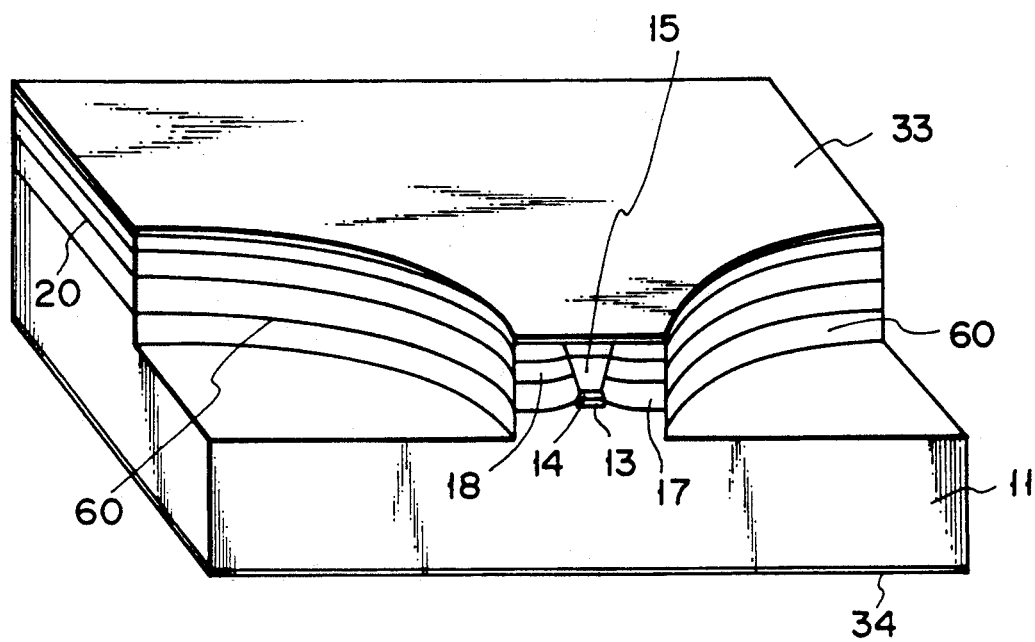
F I G. 5
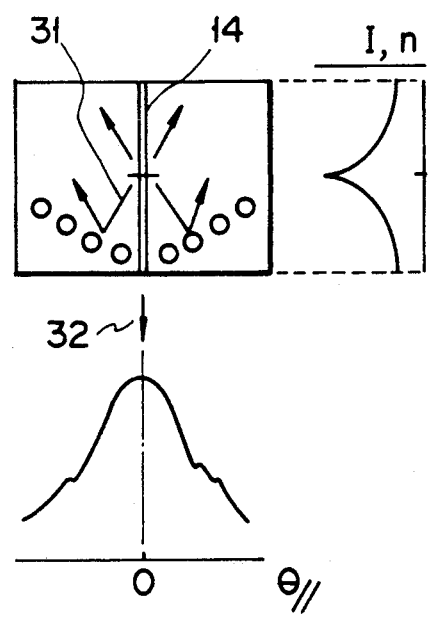
F I G. 6

PRIOR ART  PRIOR ART

SEMICONDUCTOR LASER DISTRIBUTED FEEDBACK LASER INCLUDING MODE INTERRUPT MEANS

This application is a continuation of application Ser. No. 07/734,672, filed on Jul. 23, 1991, now abandoned.

BACKGROUND OF THE INVENTION

1. Field of the Invention

The present invention relates to a semiconductor laser having a double heterostructure and, more particularly, to a distributed feedback (DFB) semiconductor laser in which a diffraction grating formed along a optical waveguide produces optical feedback.

2. Description of the Related Art

Various types of semiconductor lasers have recently been used as light sources for optical communication and optical information processing. One of the semiconductor lasers is a distributed feedback (DFB) semiconductor laser having a diffraction grating along its optical waveguide. As been derived using coupled-mode analysis, the DFB laser oscillates at a single wavelength (in a single longitudinal mode) because of wavelength selectivity of the grating. The DFB laser is particularly improved in practicability by using GaInAsP/InP material system for a light source for long-distance high-speed optical communication.

In a conventional semiconductor laser, such as a FabryPerot (FP) type semiconductor laser, optical feedback is produced by both facets of the laser which serve as reflecting mirrors. In contrast, optical feedback in the DFB semiconductor laser is produced mainly by the diffraction grating having wavelength selectivity, so that principally the facets are not necessary. In the DFB semiconductor laser, however, a single longitudinal mode capability depends upon a shape and height of the diffraction grating, the reflectivity at the facets which are inevitably formed, and the phase of the diffraction grating at the facets.

An advanced laser structure has recently been noted in which reflectivities of both cleaved facets are reduced and the phase of the grating is discontinuous at the cavity center (for example, a phase-shift corresponding to $\frac{1}{4}$ of guided wavelength $\lambda$). The DFB laser with such a structure has a great difference in threshold gain between the lasing longitudinal mode and the other modes. This type of DFB lasers therefore are remarkably advantageous to a single longitudinal mode operation. This laser however has a problem of spatial hole-burning along its axis direction (Soda et al., "Stability in Single Longitudinal Mode Operation in GaInAsP/InP Phase-Adjusted DFB Lasers," IEEE JOURNAL OF QUANTUM ELECTRONICS, Vol. QE-23, No. 6, Jun., 1987). More specifically, when a normalized coupling coefficient $\kappa L$ is more than 1.25, the power of guided waves concentrate at a position of the $\lambda/4$ phase-shift. The optical intensity profile along the axial direction causes a distribution of the carrier density in an active layer. The refractive index of an optical waveguide is distributed, corresponding to the distribution of the carrier density profile. The variation in the refractive index reduces a large gain difference, $\Delta\alpha$ between longitudinal modes and thus greatly degrades the single longitudinal mode behavior.

The holeburning also causes the following disadvantage. If the refractive index of a region of the waveguide abruptly changes, the guided mode cannot efficiently be transformed and a part of light energy is radiated as a radiation mode outside the optical waveguide. The beams of radiation mode then interferes with an output light beam emitted from an output facet. A ripple is formed by the interference in the output radiation pattern, namely, a far field pattern (FFP). Therefore, the output light beam cannot efficiently be coupled with other optical components.

FIGS. 7A and 7B are plan views of a conventional laser and views showing the FFP ($=\theta //$) of the output light beam. In FIGS. 7A and 7B, $\theta //$ indicates a full angle at half maximum in the horizontal direction of the FFP, and the optical intensity profiles (I) of guided wave in the cavity direction are shown on the right of the plan views of the laser.

FIG. 7A shows a Fabry-Perot type semiconductor laser. In this laser, the optical intensity profile I is relatively smooth and thus an undesired interference does not occur between the output light beam and radiation mode. The FFP ($\theta //$) therefore has an ideal shape without large ripples.

FIG. 7B shows a $\lambda/4$ phase shifted type DFB laser. In this laser, the guided waves concentrate at a $\lambda/4$ phase shifted position 30 (I). The irregularity of optical intensity profile along the axial direction varies the carrier density in the active layer. As described above, in a portion of the optical waveguide where its refractive index greatly changes, the guided mode cannot efficiently be transformed and part of optical energy is radiated as a radiation mode outside the guiding layer. The FFP ($\theta //$) is degraded by an interference between a radiation mode 31 and an output beam 32, as shown in FIG. 7B.

Not only the $\lambda/4$ phase shift type DFB laser but also an usual DFB laser has a drawback wherein the FFP of an output light beam of the laser is easily degraded ordered by a slight variation in refractive index.

SUMMARY OF THE INVENTION

It is accordingly an object of the present invention to provide a semiconductor laser which overcomes the above-described drawback of the conventional laser and emits a laser beam having a smooth FFP with good reproductivity.

The semiconductor laser according to the present invention comprises:
- a semiconductor substrate transparent to an oscillation light beam;
- a laser stripe including an active layer and a guiding layer formed on the semiconductor substrate 11;
- semiconductor peripheral region formed so as to cover the laser stripe on the semiconductor substrate, the semiconductor peripheral region being transparent to an oscillation light beam; and
- radiation mode light beam interrupting means arranged near both sides of the emission facet of the laser stripe, the radiation mode light beam interrupting means being formed by digging the semiconductor peripheral region and the semiconductor substrate more deeply than the laser stripe.

In other words, the above object is attained by the following method. Scoop regions each having a predetermined shape or holes each having a predetermined shape are formed more deeply than the level of the laser stripe, in the peripheral region and the semiconductor substrate including the emission facets, or in the peripheral region and the semiconductor substrate at a predetermined distance away from one or both of the emission facets of the laser.

Since the radiation mode light beam generated in the halfway point of the guiding layer is reflected and scattered by the scoop regions or holes, it does not reach the emission facets. The radiation mode light beam does not therefore interfere with an output beam and a far field pattern is thus smooth. This advantage will be greater especially when the present invention is applied to a single-mode DFB laser.

The semiconductor laser according to the present invention prevents an interference between the radiation mode emitted from a portion of the guiding layer whose refractive index is changed and the light beam emitted from the emission facets to form a uniform far field pattern. The manufacturing method of the semiconductor laser is relatively easy.

Since the emitted light beam can efficiently be coupled with other optical components, it has the great advantage of its application.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE DRAWINGS

The accompanying drawings, which are incorporated in and constitute a part of the specification, illustrate presently preferred embodiments of the invention, and together with the general description given above and the detailed description of the preferred embodiments given below, serve to explain the principles of the invention.

FIG. 5 is a perspective view showing a BH-structure DFB laser according to a third embodiment of the present invention;

FIG. 6 is a plan view of the laser shown in FIG. 4, a view showing, under the plan view, a far field pattern (FFP : $\theta$ //) of light beam output from the laser, and a view showing, on the right of the plan view, an optical intensity profile (I) or a refractive index profile (n) of guided waves in the direction of a cavity.

DETAILED DESCRIPTION OF THE PREFERRED EMBODIMENTS

Figure 1:
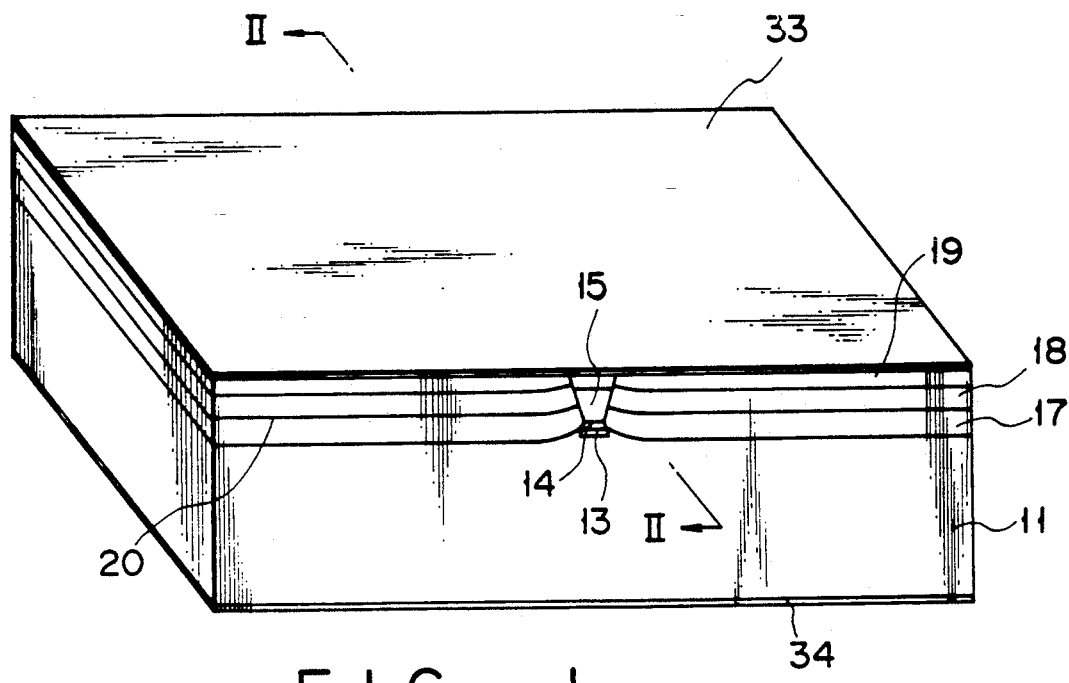
FIG. 1 is a perspective view showing a $\lambda/4$ phase shifted type GaInAsP/InP buried heterostructure (BH-structure) DFB laser to which the present invention has not been applied.
Figure 2:
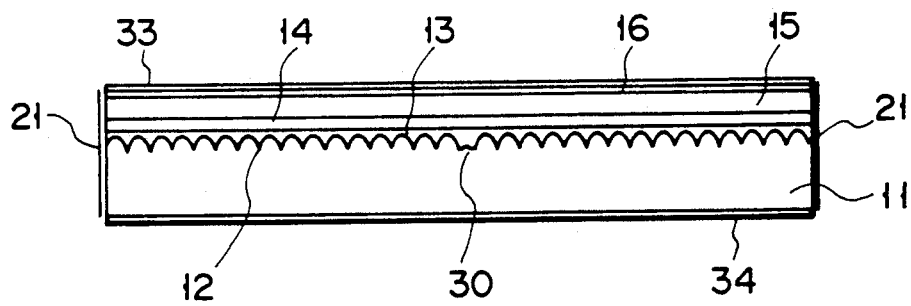
FIG. 2 is a cross-sectional view taken along line II—II of FIG. 1.

FIG. 1 is a perspective view showing a $\lambda/4$ phase sifted type GaInAsP/InP buried heterostructure (BH-structure) DFB laser, and FIG. 2 is a cross-sectional view showing a laser stripe and taken along line II—II of FIG. 1. This laser is an unimproved one to which the present invention has not been applied.

The laser is manufactured as follows. A first-order grating 12 is formed on an n-type InP substrate 11 by a two-beam interference exposure method. An n-type GaInAsP guiding layer 13 (composition: in which the band gap corresponds to a wavelength of 1.3 $\mu$m), an undoped GaInAsP active layer 14 (composition: $\lambda = 1.55$ $\mu$m), a p-type InP cladding layer 15, and a p+-type GaInAsP ohmic contact layer 16 (composition: $\lambda = 1.15$ $\mu$m) are successively grown on the first-order grating 12. A mesa-stripe portion is then formed by etching, and a p-type InP layer 17, an n-type InP layer 18 and an undoped GaInAsP cap layer 19 (composition: $\lambda = 1.15$ $\mu$m) are continuously grown around the mesa-stripe portion and the mesa-stripe portion is buried, resulting in a buried heterostructure (BH-structure). Since current is blocked by a reverse-biased pn junction 20 in a region around the buried mesa-stripe portion, the current is efficiently injected only into the stripe-shape active layer 14.

To oscillate in a single longitudinal mode, the refractive index of both cleavage facets is lowered by an anti-reflection (AR) coat 21, and a $\lambda/4$ phase shifted portion 30 is formed in the cavity center. In FIGS. 1 and 2, reference numerals 33 and 34 denote a p-side electrode and an n-side electrode, respectively.

Figure 3:
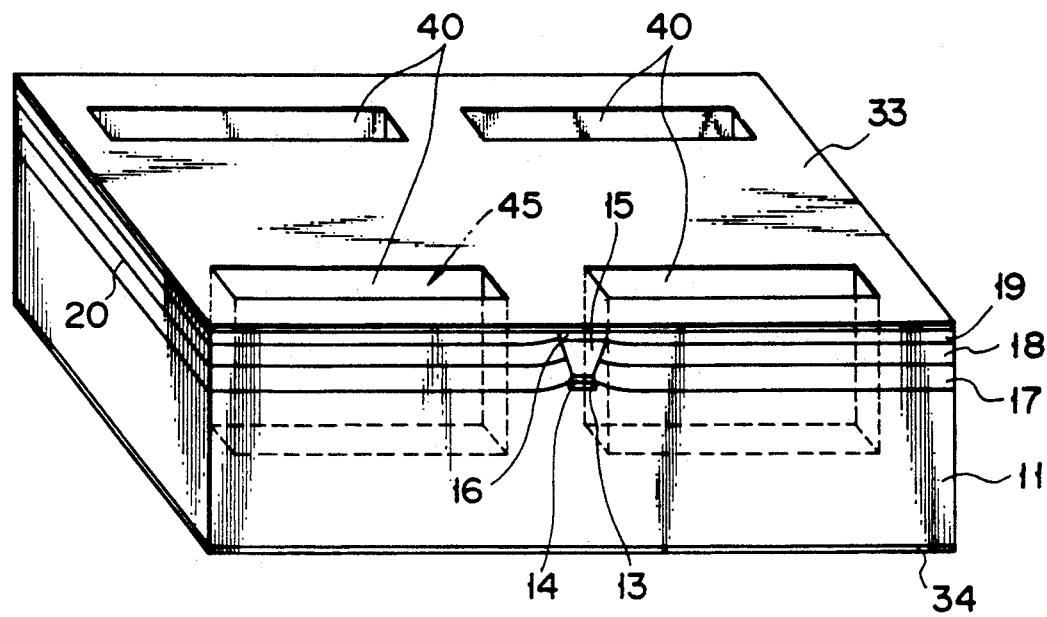
FIG. 3 is a perspective view showing a GaInAsP/InP BH-structure DFB laser according to a first embodiment of the present invention.

FIG. 3 is a perspective view showing a laser according to a first embodiment of the present invention which is applied to the GaInAsP/InP BH-structure DFB laser shown in FIGS. 1 and 2. The basic structure of the laser corresponding to that of the laser shown in FIG. 1 is achieved by the same method as described above.

Grooves 40 are formed perpendicularly to the active layer 14 in the vicinity of facets of the laser. The grooves can be patterned by photoresist-exposure procedure and digging the layer and substrate more deeply than the guiding layer 13 by ion milling. The grooves can be also formed by the well-known method such as reactive ion etching (RIE).

Beams of radiation mode generated in a halfway point of the guiding layer 13 is reflected by the grooves and does not reach the output facet of the laser. The radiation mode does not interfere with an output beam from the laser and therefore the FFP can be kept smooth.

Figure 4:
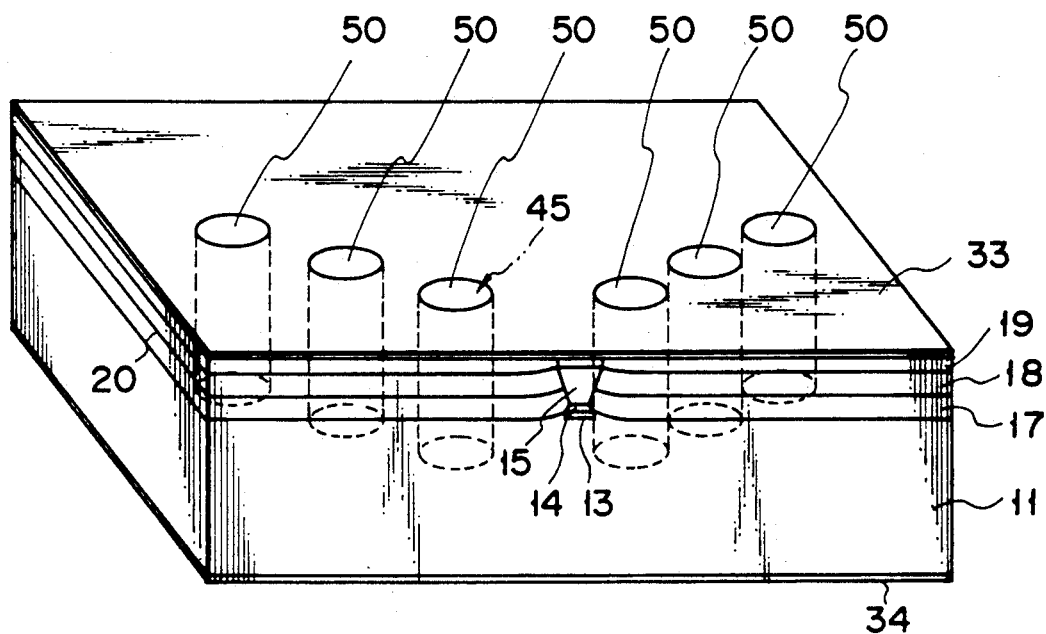
FIG. 4 is a BH-structure DFB laser according to a second embodiment of the present invention.
Figures 7A, 7B:
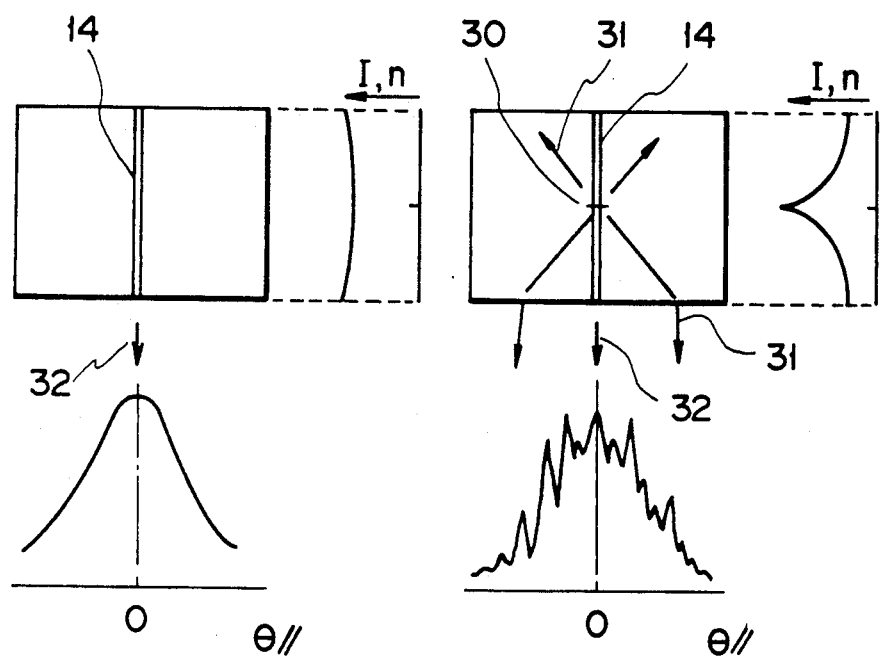
FIGS. 7A and 7B are plan views showing conventional lasers, views showing, under the plan views, far field patterns (FFP : $\theta$ //) of light beams output from the lasers, and views showing, on the right of the plan views, optical intensity profiles (I) or refractive index profiles (n) of guided waves in the direction of a cavity.

FIG. 4 is a perspective view showing a laser according to a second embodiment of the present invention which is applied to the laser shown in FIGS. 1 and 2. The basic structure of the laser corresponding to that of the laser shown in FIG. 1 is achieved by the same method as described above.

In the second embodiment, a plurality of columnar holes 50 is formed in the vicinity of the output facet. The holes can be also formed by the photoresist procedure deeply digging the layers and substrate by the ion milling.

Beams of radiation mode generated in a halfway point of the guiding layer is reflected and scattered by the holes 50 and does not reach the output facet. The radiation mode does not interfere with an output beam 32 from the laser and therefore the FFP is kept smooth, which is shown in FIG. 6. The holes are so arranged that the radiation mode 31 is effectively scattered.

In the first and second embodiments, the grooves 40 or holes 50 are filled with polyimide 45 or the like serving as light absorbing material, as indicated by arrows in FIGS. 3 and 4. The radiation mode is not only irregularly reflected by the grooves 40 or holes 50, but also absorbed by the polyimide with which they are filled. The radiation mode light beam is reliably prevented from reaching the output facet.

FIG. 5 is a perspective view showing a laser according to a third embodiment which is applied to the laser shown in FIGS. 1 and 2. The basic structure of the laser corresponding to that of the laser shown in FIG. 1 is achieved by the same method as described above.

In the third embodiment, peripheral region near the output facet are removed, together with the facet, itself, by digging the layers and substrate by ion milling, as shown in FIG. 5. The curve of the removed region 60 is so designed that the radiation mode light beam is effectively reflected and it is not emitted forward. Thus the radiation mode does not interfere with the output beam 32 and a far field pattern (FFP) is uniformly formed as shown in FIG. 6.

The present invention can be applied to a laser having arbitrary removed region or holes, without departing from the scope or spirit of the subject matter of the invention. The present invention is not limited to a DFB laser but can be applied to a general semiconductor laser such as a Fabry-Perot (FP) type laser and a composite cavity type laser.

Additional advantages and modifications will readily occur to those skilled in the art. Therefore, the invention in its broader aspects is not limited to the specific details, and representative devices, shown and described herein. Accordingly, various modifications may be made without departing from the spirit or scope of the general inventive concept as defined by the appended claims and their equivalents.

What is claimed is:

1. A semiconductor laser comprising:
a semiconductor substrate transparent to an oscillation light beam;
a laser stripe through which an electric current flows, including an active laser, a guiding layer formed on said semiconductor substrate, and a diffraction grating formed along said guiding layer;
a phase shifted portion formed at a halfway point of said diffraction grating;
a semiconductor peripheral region formed so as to cover said laser stripe on said semiconductor substrate, said semiconductor peripheral region being transparent to an oscillation light beam; and
interrupting means for interrupting a radiation mode light beam radiated from said phase shifted portion to said semiconductor peripheral region, said interrupting means being located near both sides of the emission end of said laser stripe and in said semiconductor peripheral region so as not to interrupt an output light beam, and being formed by digging said semiconductor peripheral region and said semiconductor substrate to a greater depth than said laser stripe.

2. The semiconductor laser according to claim 1, wherein said interrupting means comprises rectangular grooves formed by digging said semiconductor peripheral region and said semiconductor substrate near both sides of the emission end of said laser stripe.

3. The semiconductor laser according to claim 2, wherein said grooves are arranged near both ends of said laser stripe.

4. The semiconductor laser according to claim 1, wherein said interrupting means comprises round holes formed by digging said semiconductor peripheral region and said semiconductor substrate near both sides of the emission end of said laser stripe.

5. The semiconductor laser according to claim 1, wherein said interrupting means comprises scoop regions formed by removing said semiconductor peripheral region and said semiconductor substrate on both sides of the emission end of said laser stripe.

6. The semiconductor laser according to claim 2, wherein said grooves are filled with a light absorbing material.

7. The semiconductor laser according to claim 4, wherein said holes are filled with a light absorbing material.

8. The semiconductor laser according to claim 1, wherein said interrupting means is located between said emission end and said phase shifted portion.

9. The semiconductor laser according to claim 1, wherein said semiconductor laser is a distributed feedback semiconductor laser for applying optical feedback by use of said diffraction grating.

10. The semiconductor laser according to claim 1, wherein both end of said laser stripe are cleavage facets aligned with cleavage facets of said semiconductor peripheral region and semiconductor substrate.

11. The semiconductor laser according to claim 10, wherein coats having a low reflectivity are provided on said cleavage facets.

* * * * *